US009443761B2

(12) United States Patent
Shao et al.

(10) Patent No.: US 9,443,761 B2
(45) Date of Patent: Sep. 13, 2016

(54) METHODS FOR FABRICATING INTEGRATED CIRCUITS HAVING DEVICE CONTACTS

(71) Applicant: GLOBALFOUNDRIES Singapore Pte. Ltd., Singapore (SG)

(72) Inventors: Wei Shao, Singapore (SG); Fan Zhang, Singapore (SG); Wuping Liu, Singapore (SG); Wei Lu, Singapore (SG); Vish Srinivasan, Singapore (SG); Juan Boon Tan, Singapore (SG)

(73) Assignee: GLOBALFOUNDRIES SINGAPORE PTE. LTD., Singapore (SG)

( * ) Notice: Subject to any disclaimer, the term of this patent is extended or adjusted under 35 U.S.C. 154(b) by 0 days.

(21) Appl. No.: 14/445,520

(22) Filed: Jul. 29, 2014

(65) Prior Publication Data

US 2016/0035623 A1    Feb. 4, 2016

(51) Int. Cl.
*H01L 23/48* (2006.01)
*H01L 21/768* (2006.01)
*H01L 23/532* (2006.01)
*H01L 23/485* (2006.01)

(52) U.S. Cl.
CPC ... *H01L 21/76879* (2013.01); *H01L 21/76843* (2013.01); *H01L 21/76895* (2013.01); *H01L 23/485* (2013.01); *H01L 23/53266* (2013.01)

(58) Field of Classification Search
CPC ............ H01L 21/76807; H01L 21/76811; H01L 21/76847; H01L 21/76849; H01L 21/76864; H01L 21/76877; H01L 23/485; H01L 23/53223

USPC ................. 257/774; 438/637, 672
See application file for complete search history.

(56) References Cited

U.S. PATENT DOCUMENTS

| | | | |
|---|---|---|---|
| 2005/0263891 A1* | 12/2005 | Lee ............... | H01L 21/76805 257/751 |
| 2010/0065949 A1* | 3/2010 | Thies ............ | H01L 21/76898 257/621 |
| 2012/0193717 A1* | 8/2012 | Katakami ....... | H01L 29/665 257/348 |
| 2015/0206846 A1* | 7/2015 | Lo ................. | H01L 24/05 257/737 |

OTHER PUBLICATIONS

Lee et al., "Oxygen Potential Engineering of Interfacial Layer for Deep Sub-nm EOT High-k Gate Stacks on Ge", Department of Materials Engineering, 2013, pp. 2.5.1-2.5.4.

* cited by examiner

*Primary Examiner* — Dung Le
(74) *Attorney, Agent, or Firm* — Lorenz & Kopf, LLP

(57) ABSTRACT

Methods for fabricating integrated circuits are provided. In one example, a method for fabricating an integrated circuit includes providing a semiconductor device with a metal silicide electrically coupled thereto. A contact opening exposing the metal silicide is formed to the semiconductor device. A conductive material is deposite within the contact opening to form a contact to the metal silicide while simultaneously forming a contact seam void within the contact. A self-aligned conductive material is deposited within the contact to form a conductive plug that at least partially fills the contact seam void, and a metallization layer is deposited overlying the contact.

9 Claims, 4 Drawing Sheets

METHODS FOR FABRICATING INTEGRATED CIRCUITS HAVING DEVICE CONTACTS

TECHNICAL FIELD

The technical field relates generally to integrated circuits and methods for fabricating integrated circuits, and more particularly relates to integrated circuits having device contacts and methods for fabricating such integrated circuits.

BACKGROUND

Conductive contacts are formed to electrically connect various semiconductor devices (e.g., source/drain regions of metal oxide semiconductor field effect transistors (MOS-FETs) or MOS transistors) of integrated circuits (ICs) to metal interconnects in an integrated circuit. The contacts are conventionally formed by patterning and etching a dielectric material layer to form a contact opening, depositing a liner/barrier layer, typically a combination of layers, such as titanium (Ti), tantalum (Ta), ruthenium (Ru), titanium nitride (TiN), tantalum nitride (TaN), tungsten nitride (WN), and/or cobalt (Co) to line the side surfaces and bottom of the contact opening, and depositing a conductive material, such as tungsten (W) or copper (Cu) to fill the contact opening. The liner-barrier prevents diffusion of the conductive material into the dielectric material layer and enhances adhesion of the conductive material to the walls of the contact opening.

As feature sizes decrease from 150 nanometers (nm) to 90 nm, then to 45 nm and below (e.g., 32 nm, 20 nm, and below), the aspect ratio (e.g., height to diameter/width) of contacts and their corresponding contact openings substantially increase. As such, filling the contact openings with conductive material can be more challenging and lead to poor fill with large seam voids and higher resistance. Additionally, it has been found that when such ICs are electrically stressed, material from the metallization layer can undesirably breakthrough the liner/barrier layer above a large seam void and diffuse through the contact to the contact-device region interface which can impact the reliability of the IC.

Accordingly, it is desirable to provide integrated circuits having device contacts with low resistance and protection against breakthrough of the liner/barrier layer by material of the metallization layer, and methods for fabricating such integrated circuits. Furthermore, other desirable features and characteristics of the present invention will become apparent from the subsequent detailed description and the appended claims, taken in conjunction with the accompanying drawings and this background.

BRIEF SUMMARY

Integrated circuits and methods for fabricating integrated circuits are provided herein. In accordance with an exemplary embodiment, a method for fabricating an integrated circuit includes providing a semiconductor device with a metal silicide electrically coupled thereto. A contact opening is formed to the semiconductor device and exposing the metal silicide. A conductive material is deposited within the contact opening to form a contact to the metal silicide while simultaneously forming a contact seam void within the contact. A self-aligned conductive material is deposited within the contact to form a conductive plug that at least partially fills the contact seam void, and a metallization layer is deposited overlying the contact.

In accordance with another exemplary embodiment, a method for fabricating an integrated circuit is provided. The method includes providing a semiconductor device comprising a first interlayer dielectric (ILD) layer overlying a device region. A contact opening is formed in the first ILD, exposing at least a portion of the device region. The contact opening is filled with conductive material to form a contact while simultaneously forming a contact seam void in the conductive material. A self-aligned conductive material is deposited to at least partially fill the contact seam void and define a conductive plug. A second ILD layer of dielectric material is deposited overlying the first ILD layer and the contact. The second ILD layer is etched to form a metallization trench to expose the contact. A liner is formed in the metallization trench overlying the contact, and a conductive material is deposited overlying the liner.

In accordance with another exemplary embodiment, an integrated circuit is provided. The integrated circuit includes a device region and an interlayer dielectric (ILD) layer overlying the device region. A contact extends through the ILD layer to the device region. The contact has a contact seam void therein. A conductive plug at least partially made of a self-aligned conductive material at least partially fills the contact seam void.

BRIEF DESCRIPTION OF THE DRAWINGS

The various embodiments will hereinafter be described in conjunction with the following drawing figures, wherein like numerals denote like elements, and wherein.

DETAILED DESCRIPTION

Figure 1:
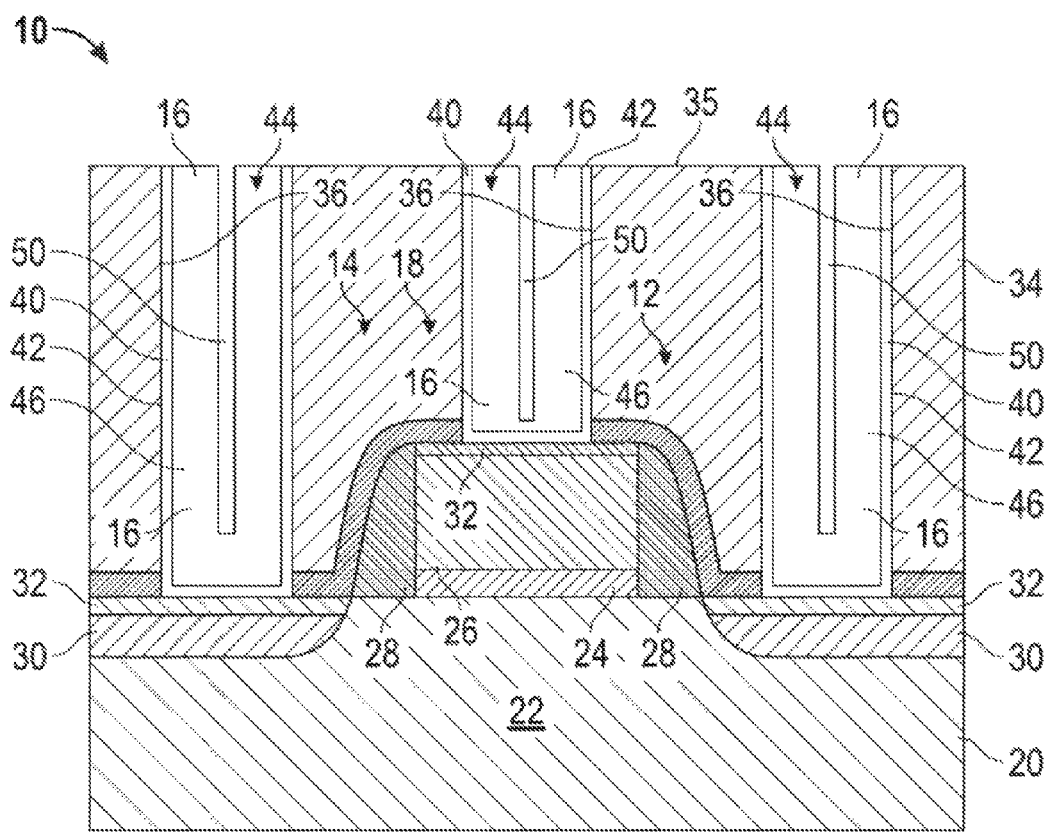
FIG. 1 illustrates, in cross-sectional view, an integrated circuit during an intermediate fabrication stage in accordance with an exemplary embodiment.

The following Detailed Description is merely exemplary in nature and is not intended to limit the various embodiments or the application and uses thereof. Furthermore, there is no intention to be bound by any theory presented in the preceding background or the following detailed description.

The majority of present day integrated circuits (ICs) are implemented by using a plurality of interconnected field effect transistors (FETs), also called metal oxide semiconductor field effect transistors (MOSFETs or MOS transistors). A MOS transistor includes a gate electrode as a control electrode overlying a semiconductor substrate and spaced-apart source and drain regions in the substrate between which a current can flow. A gate insulator is disposed between the gate electrode and the semiconductor substrate to electrically isolate the gate electrode from the substrate. A control voltage applied to the gate electrode controls the flow of current through a channel in the substrate underlying the gate electrode between the source and drain regions.

As used herein, the term "semiconductor substrate" will be used to encompass semiconductor materials conventionally used in the semiconductor industry from which to make electrical devices. Semiconductor materials include monocrystalline silicon materials, such as the relatively pure or lightly impurity-doped monocrystalline silicon materials typically used in the semiconductor industry, as well as polycrystalline silicon materials, and silicon admixed with other elements such as germanium, carbon, and the like. In addition, "semiconductor material" encompasses other materials such as relatively pure and impurity-doped germanium, gallium arsenide, zinc oxide, glass, and the like. The semiconductor material is preferably a silicon substrate. The silicon substrate may be a bulk silicon wafer or may be a thin layer of silicon on an insulating layer (commonly known as silicon-on-insulator or SOI) that, in turn, is supported by a carrier wafer.

Various embodiments contemplated herein relate to integrated circuits having device contacts and methods for fabricating integrated circuits having device contacts. During intermediate stages of fabrication of an integrated circuit (IC), a contact opening is etched into a first interlayer dielectric (ILD) material that overlies a device region of the IC. In an exemplary embodiment, a liner of barrier material, e.g., Ti and/or TiN, is formed in the contact opening and the contact opening is filled with conductive material to form a contact. Due to the large aspect ratio of the contact opening, it is difficult to completely fill the opening with the conductive material. As a result, a void is formed in the conductive material forming the contact (i.e. a contact seam void) and the contact is planarized to expose this void. Contact seam voids are undesirable as they contribute to contact resistance and potentially introduce reliability concerns.

In an exemplary embodiment, a self-aligned conductive material, such as a tungsten-based, nickel-based, or silver-based self-aligned conductive material is deposited overlying the first ILD layer, the contact, and the exposed contact seam void to form a layer of the self-aligned conductive material overlying the first ILD layer and at least partially filling the contact seam void with the self-aligned conductive material. The self-aligned conductive material disposed in the contact seam void forms a conductive plug in the contact. The layer of self-aligned conductive material is planarized to expose the contact with the conductive plug and the first ILD layer.

As used herein, the term "self-aligned conductive material" is used to describe a conductive material that when deposited on a surface of a substrate forms a conductive material that is self-aligned on the molecular scale. Exemplary self-aligned conductive materials include certain tungsten-based materials (e.g., WCoP, WCoB, and WN), certain nickel-based materials (e.g., NiWP, NiP, NiTi), and certain silver-based materials (e.g., Ag-based nanoclusters). In some embodiments, self-aligned conductive materials are used which are capable of selectively forming a passivation layer on a tungsten surface. In some embodiments, self-aligned conductive materials are used which selectively will not form a layer on a TEOS surface. In some embodiments, a self-aligned contact material is selected that has low resistivity, such as a silver-based material. In these embodiments, the low resistivity of the self-aligned contact material decrease contact resistance, and improve contact longevity.

A second ILD layer of dielectric material is deposited overlying the first ILD layer and the contact. The second ILD layer is etched to form a metallization trench that exposes the contact. In an exemplary embodiment, a liner of barrier material, e.g., Ta and/or TaN, is formed in the metallization trench overlying the contact. A metallization layer is formed, for example by electrical-chemical plated Cu, in the metallization trench overlying the liner. It has been found that by at least partially filling the contact seam void with a self-aligned conductive material to form the conductive plug, the contact is more robust such that, for example, during electrical stressing of the IC, the metallization layer does not breakthrough the liner/barrier layer and diffuse through the contact seam void to the contact-device region interface. Moreover, the conductive plug promotes lower resistance of the contact improving overall robustness of the contact.

FIGS. 1-4 illustrate, in cross-sectional view, an IC 10 during various fabrication stages. The IC 10 includes a semiconductor device 12 that is disposed along a device region 14 with contacts 16, e.g., device contacts, in accordance with various embodiments. The described process steps, procedures, and materials are to be considered only as exemplary embodiments designed to illustrate to one of ordinary skill in the art methods for practicing the invention; the invention is not limited to these exemplary embodiments. The illustrated portions of the IC 10 include only a single semiconductor device 12, although those of ordinary skill in the art will recognize that an actual IC can include a large number of such semiconductor devices. The semiconductor device 12 may be a diode, a bipolar transistor, a MOS device, or the like. For purposes of illustration, FIGS. 1-4 illustrate the semiconductor device 12 as a MOS device. Various steps in the manufacture of ICs and MOS devices are well known and so, in the interest of brevity, many conventional steps will only be mentioned briefly herein or will be omitted entirely without providing the well-known process details. Although the term "MOS device" properly refers to a semiconductor device having a metal gate electrode and an oxide gate insulator, that term will be used throughout to refer to any semiconductor device that includes a conductive gate electrode (whether metal or other conductive material) that is positioned over a gate insulator (whether oxide or other insulator) which, in turn, is positioned over a semiconductor substrate.

FIG. 1 illustrates a portion of the IC 10 at an intermediate stage of fabrication in accordance with an exemplary embodiment. As illustrated, the semiconductor device 12 is a MOS transistor 18, which can be N-channel or P-channel MOS transistor. The MOS transistor 18 is fabricated on a semiconductor substrate 20, which can be either a bulk wafer as illustrated or a thin layer on an insulating substrate (SOI). At least a surface portion 22 of the semiconductor substrate 20 is doped with P-type conductivity-determining impurities for the fabrication of an N-channel MOS transistor or with N-type conductivity-determining impurities for the fabrication of a P-channel MOS transistor. The surface portion 22 can be impurity doped, for example, by the implantation and subsequent thermal annealing of dopant ions such as boron or arsenic ions.

A layer of gate insulating material 24 is formed at the surface of the surface portion 22 and a gate electrode 26 is formed overlying the layer of gate insulating material 24 and the surface portion 22. The layer of gate insulating material 24 can be a layer of thermally grown silicon dioxide, or alternatively, a deposited insulator such as a silicon oxide, silicon nitride, a high dielectric constant insulator such as hafnium silicate ($HfSiO_x$, where x is greater than zero), or the like. The deposited insulators can be deposited, for example, by chemical vapor deposition (CVD), low pressure chemical vapor deposition (LPCVD), or plasma enhanced chemical vapor deposition (PECVD). The layer of gate insulating material 24 may have a thickness of from about 1 to about 10 nm, although the actual thickness can be determined based on the application of the transistor in the circuit being implemented. The gate electrode 26 includes an electrically conductive material, such as a metal or metal alloy, or a material that can be made electrically conductive and formed by depositing, patterning, and etching, for example, a layer of polycrystalline silicon, such as a layer of undoped polycrystalline silicon. The gate electrode 26 generally has a thickness of from about 50 to about 300 nm. The polycrystalline silicon can be deposited, for example, by the reduction of silane in a CVD reaction.

Sidewall spacers 28 are formed on the sidewalls of the gate electrode 26. The sidewall spacers 28 are formed by depositing a layer of insulating material such as silicon oxide and/or silicon nitride and subsequently anisotropically etching the insulating layer, for example by reactive ion etching (RIE). Alternatively, silicon oxide and silicon nitride can be etched, for example, with a $CHF_3$, $CF_4$, or $SF_6$ chemistry.

Conductivity-determining ions are implanted into the semiconductor substrate 20 to form source and drain regions 30. If the surface portion 22 of the semiconductor substrate 20 is P-type, N-type conductivity-determining ions are implanted to form N-type source and drain regions in the semiconductor substrate 20 and to conductivity dope the gate electrode 26 with N-type impurities. The implanted ions can be, for example, either phosphorus or arsenic ions. Alternatively, if the surface portion 22 of the semiconductor substrate 20 is N-type, P-type conductivity-determining ions are implanted to form P-type source and drain regions in the silicon substrate 20 and to conductivity dope the gate electrode 26 with P-type impurities. The implanted ions can be, for example, boron ions. The source and drain regions 30 are self-aligned with the gate electrode 26. As those of skill in the art will appreciate, additional sidewall spacers and additional implantations may be employed to create drain extensions, halo implants, deep source and drains, and the like.

In accordance with an exemplary embodiment, a layer of silicide-forming metal (not shown) is deposited over the device region 14 and in contact with the source and drain regions 30 and the gate electrode 26. Examples of silicide-forming metals include, but are not limited to, nickel, cobalt, and alloys thereof. The silicide-forming metal can be deposited, for example by sputtering, to a thickness of from about 4 to about 50 nm, such as about 10 nm. In one embodiment, the device region 14 with the silicide-forming metal is heated, for example by RTA, to cause the silicide-forming metal to react with exposed silicon to form metal silicide regions 32 at the surface of the source and drain regions 30 and the gate electrode 26. The metal silicide forms only in those areas where there is exposed silicon. Metal silicide does not form, and the silicide forming metal remains unreacted, in those areas where there is no exposed silicon, such as on the sidewall spacers 28. The unreacted silicide-forming metal can be removed by wet etching in a $H_2O_2/H_2SO_4$ or $HNO_3/HCl$ solution.

After the formation of metal silicide regions 32, an ILD layer 34 of insulating material (e.g., dielectric material such as silicon oxide) is deposited overlying the device region 14. In an exemplary embodiment, the ILD layer 34 is deposited by a low temperature process and may be deposited, for example by a LPCVD process.

In an exemplary embodiment, a top surface 35 of the ILD layer 34 is planarized, for example by a chemical mechanical planarization (CMP) process. The ILD layer 34 is etched to form sidewalls 36 that correspondingly define contact openings 38 (e.g., vias) formed through the ILD layer 34 exposing the metal silicide regions 32. The contact openings 38 expose portions of the metal silicide regions 32 on the source and drain regions 30 and the gate electrode 26. Depending on the circuit being implemented, however, the contact opening 38 to the gate electrode 26 may or may not be formed.

In an exemplary embodiment, a liner-forming material(s) 40 is deposited overlying the sidewalls 36 and the metal silicide regions 32 to define liners 42 correspondingly disposed in the contact openings 38. In an exemplary embodiment, the liner forming material 40 is formed by depositing Ti and/or TiN to form one or more barrier layers that define the liners 42. As illustrated, the liners 42 are formed directly on the sidewalls 36 and the metal silicide regions 32 and define inner cavities 44 correspondingly in the contact openings 38. Any liner-forming material 40 deposited on the top surface 35 of the ILD layer can be subsequently removed by a CMP process.

A conductive material 46 is deposited into the inner cavities 44 overlying the liners 42 to fill the contact openings 38 and form contacts 16. In an exemplary embodiment, the conductive material 46 is tungsten although other conductive materials known to those skilled in the art may also be used to form the contacts 16. The conductive material 46 may be deposited using well known deposition techniques such as CVD. As illustrated, deposition of conductive material 46 into the inner cavities 44 coats the interior surfaces of the inner cavities 44, leaving contact seam voids 50 formed therein. Note that the contact seam voids 50 are not deliberately formed. Instead, the inner cavities 44 are difficult to fill completely with conductive material 46 due to the large aspect ratio of the cavities 44. In an exemplary embodiment, any excess conductive material 46, for example disposed above the ILD layer 34, is removed and the contact seam voids 50 are exposed by planarizing the conductive material using for example a CMP process.

Figure 2:
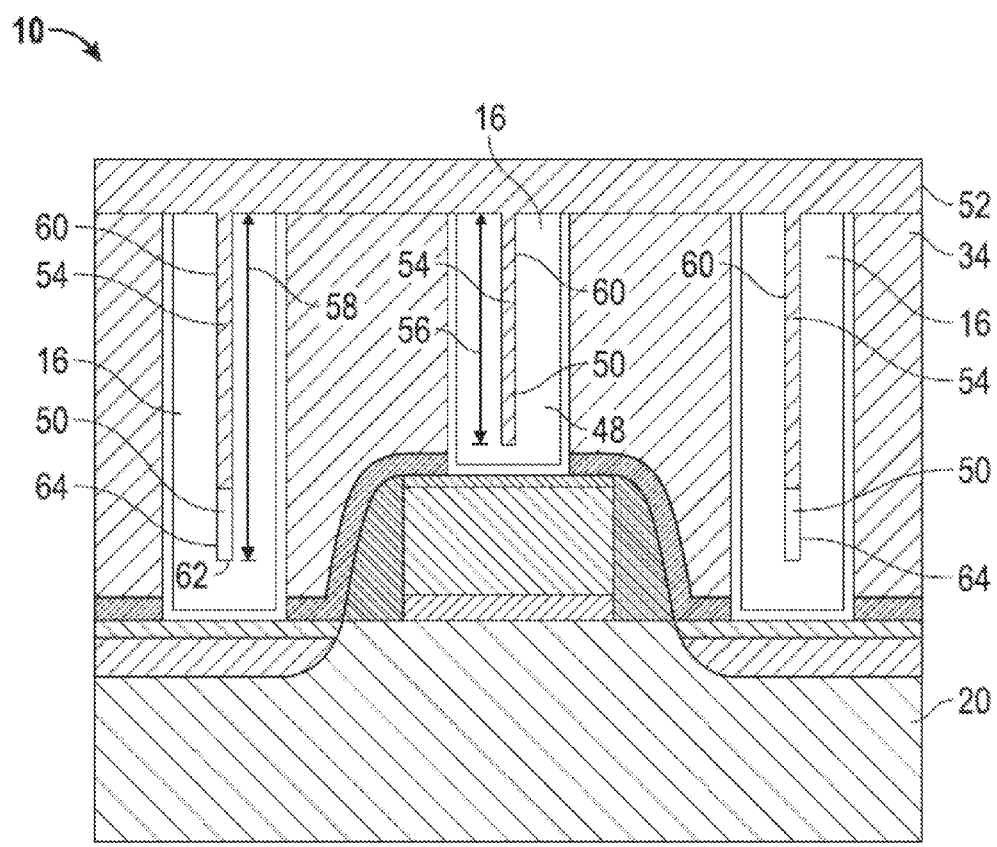
FIG. 2 illustrates, in cross-sectional view, an integrated circuit during a further advanced fabrication stage in accordance with an exemplary embodiment.
Figure 3:
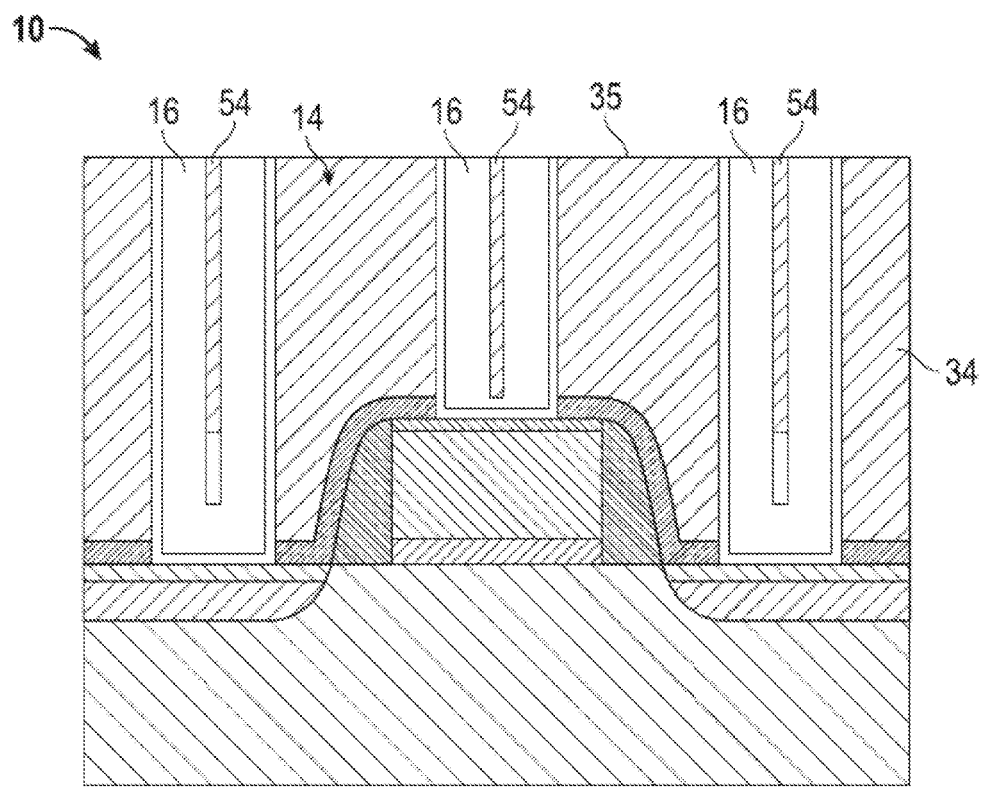
FIG. 3 illustrates, in cross-sectional view, an integrated circuit during a further advanced fabrication stage in accordance with an exemplary embodiment.

FIGS. 2 and 3 illustrate the IC 10 at further advanced fabrication stages in accordance with an exemplary embodiment. A relatively thin layer of a self-aligned conductive material is deposited to at least partially fill the contact seam voids 50 and to form a self-aligned conductive material layer 52 overlying the ILD layer 34 and the contacts 16. In an exemplary embodiment, the self-aligned conductive material is deposited such that the self-aligned conductive material layer 52 overlying the ILD layer 34 has a thickness of about 3 to about 20 nm, for example of about 5 to about 10 nm. The self-aligned conductive material that at least partially fills the contact seam voids 50 forms conductive plugs 54. In an exemplary embodiment, electroless plating from solvent is used to deposit the self-aligned conductive material and fill the relatively high aspect ratio contact seam voids 50. In an exemplary embodiment, the conductive plugs 54 fill at least about 50% of the depths (indicated by double headed arrows 56 and 58) of the contact seam voids 50, such as about 50 to about 100%, for example about 75 to about 100%, for example about 90 to about 100% of the depths of the contact seam voids 50. In an exemplary embodiment, the conductive plugs 54 fill substantially all (i.e., about 100%) of the contact seam voids 50. It has been found that by filling at least about 50% of the depth of a corresponding contact seam void 50 such as the upper portion 60, the conductive plug functions as a suitable barrier for diffusion of a metallization layer as will be described in further detail below. It has further been found that filling a contact seam void 50 with a self-aligned conductive material via electroless plating from solvent has a benefit over gas-phase deposition techniques, such as CVD, in that the contact seam voids 50 gas-phase deposition techniques are more likely to form conductive plugs that do not substantially fill the contact seam void 50. Forming the conductive plugs via a liquid-phase technique such as electroless plating from solvent facilitates substantially filling the contact seam void 50 with the conductive plug. In an exemplary embodiment, forming the conductive plugs via a liquid-phase technique includes exposing the contact seam void opening to an electroless plating solution, such as by dipping. Unlike electroplating, electroless plating does not require application of an electric current through the solution for deposition to occur. Further, an electroless plating solution is selected that is compatible with the surface of conductive material 46 such that the electroless plating solution easily fills the contact voids 50. As such, deposition proceeds such that the self-aligned conductive material 52 at least partially fill the contact voids 50, as indicated above.

In various embodiments, the particular conditions (e.g., time, temperature, reagent concentrations in the plating solution, etc.) employed for electroless plating may vary depending on the particular self-aligned material being deposited. It is intended that conventional electroless plating procedures readily identifiable by those of skill in the art may be used. In some embodiments, the rate and extend of deposition may be controlled by the temperature at which deposition is conducted, and may occur from about 100° C. to about 300° C. In one exemplary embodiment, the self-aligned conductive material 52 comprises nickel phosphide (NiP), which is electrolessly deposited via a reaction of a Ni complex in solution with $H_2PO_3$.

The process continues as illustrated in FIG. 3 by removing a portion of the self-aligned conductive material layer 52 (shown in FIG. 2) to expose the top surface 35 of the ILD layer 34 and the contacts 16 including the conductive plugs 54. It should be understood that the conductive plugs 54 are made of the same self-aligned conductive material that makes up the self-aligned conductive material layer 52, and that both the conductive plugs 54 and the self-aligned conductive material layer 52 were deposited at the same time, as described above. In an exemplary embodiment, a portion of the self-aligned conductive material layer 52 is removed by planarizing using a CMP process, such as a mild CMP process (e.g., by reducing polish pad down-force and optimizing polishing time) to remove the self-aligned conductive material layer 52 and expose the contact surface without disrupting or damaging the conductive plugs 54.

Figure 4:
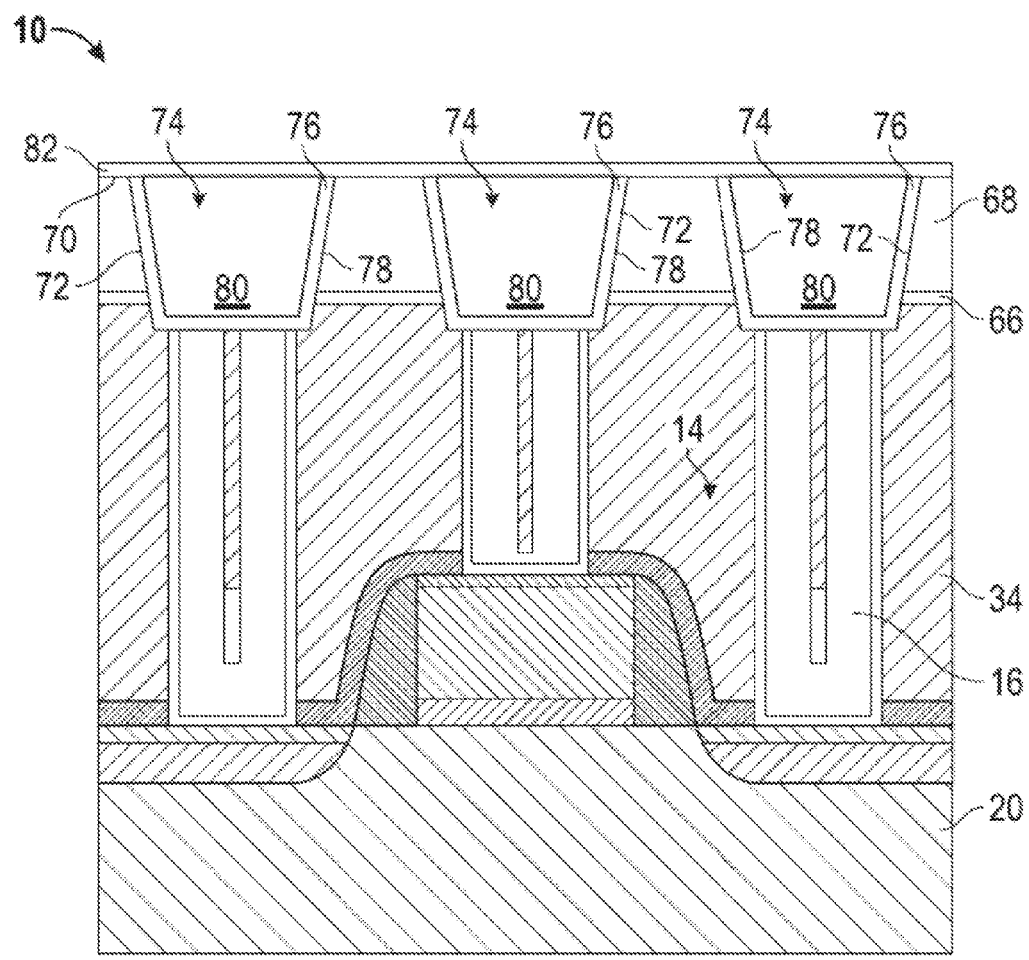
FIG. 4 illustrates, in cross-sectional view, an integrated circuit during a further advanced fabrication stage in accordance with an exemplary embodiment.

FIG. 4 illustrates the IC 10 at a further advanced fabrication stage in accordance with an exemplary embodiment. The process continues by optionally depositing an etch stop layer 66 formed of, for example, a nitride material, e.g., silicon nitride. An ILD layer 68 is deposited overlying the ILD layer 34 and the etch stop layer 66, for example, by a LPCVD process. A top surface 70 of the ILD layer 68 is planarized, for example, by a CMP process. As illustrated, the ILD layer 68, the etch stop layer 66, and upper portions of the ILD layer 34 and the contacts 16 are etched to form sidewalls 72 that define metallization trenches 74 that expose the contacts 16.

In an exemplary embodiment, a liner-forming material(s) 76 is deposited overlying the sidewalls 72, and the contacts 16 to define liners 78 correspondingly disposed in the metallization trenches 74. In an exemplary embodiment, the liner-forming material 76 is formed by depositing Ti and/or TiN to form one or more barrier layers that define the liners 78. Any liner-forming material deposited on the top surface 70 of the ILD layer 68 can be subsequently removed by a CMP process.

Copper (Cu) or other conductive material is deposited overlying the liners 78 to form metallization layers 80. In an exemplary embodiment, the metallization layers 80 are formed by selectively depositing Cu using an electrochemical plating (ECP) process. As illustrated, an N-doped silicon carbide (SiCN) layer 82 is deposited overlying the metallization layers 80 and the expose portions of the ILD layer 68 to form a protective cap layer.

Accordingly, integrated circuits including devices and methods for fabricating such integrated circuits have been described. In an exemplary embodiment, an integrated circuit is fabricated by forming a conductive plug of a self-aligned conductive material that at least partially fills an exposed contact seam void formed in a contact. The contact extends through an ILD layer of dielectric material that overlies a device region of the integrated circuit. In an exemplary embodiment, a liner is formed overlying the ILD layer, and the contact and a metallization layer are deposited overlying the liner.

While at least one exemplary embodiment has been presented in the foregoing detailed description of the disclosure, it should be appreciated that a vast number of variations exist. It should also be appreciated that the exemplary embodiment or exemplary embodiments are only examples, and are not intended to limit the scope, applicability, or configuration of the disclosure in any way. Rather, the foregoing detailed description will provide those skilled in the art with a convenient road map for implementing an exemplary embodiment of the disclosure. It being understood that various changes may be made in the function and arrangement of elements described in an exemplary embodiment without departing from the scope of the disclosure as set forth in the appended claims.

What is claimed is:

1. A method for fabricating an integrated circuit, the method comprising:
   providing a semiconductor device with a metal silicide electrically coupled thereto;
   forming a contact opening to the semiconductor device and exposing the metal silicide;
   depositing a conductive material within the contact opening to form a contact to the metal silicide while simultaneously forming a contact seam void within the contact;
   depositing a self-aligned conductive material within the contact to form a conductive plug that at least partially fills the contact seam void; and
   depositing a metallization layer overlying the contact.

2. The method of claim 1, wherein the self-aligned conductive material comprises a tungsten-based, nickel-based, or silver-based self-aligned conductive material.

3. The method of claim 1, wherein the self-aligned conductive material comprises tungsten cobalt phosphide (WCoP), tungsten cobalt boride (WCoB), tungsten nitride (WN), nickel tungsten phosphide (NiWP), nickel phosphide (NiP), nickel titanium (NiTi), or silver (Ag)-based nanoclusters.

4. The method of claim 1, wherein the contact comprises tungsten.

5. The method of claim 1, wherein forming the conductive plug comprises filling about 50 to about 100% of the contact seam void with the conductive plug.

6. The method of claim 1, wherein forming the conductive plug comprises filling about 100% of the contact seam void with the conductive plug.

7. The method of claim 1, wherein forming the conductive plug comprising the self-aligned conductive material comprises depositing the self-aligned conductive material in at least a portion of the contact seam void by electroless plating of the self-aligned conductive material from solution.

8. The method of claim 1, further comprising forming a liner overlying the contact, wherein depositing the metallization layer comprises depositing the metallization layer overlying the liner.

9. The method of claim 1, wherein depositing the metallization layer comprises depositing copper using an electrochemical plating process to form the metallization layer.

* * * * *